US006638378B2

(12) United States Patent
O'Bryan et al.

(10) Patent No.: US 6,638,378 B2
(45) Date of Patent: Oct. 28, 2003

(54) PASSIVE ELECTRICAL ARTICLE, CIRCUIT ARTICLES THEREOF, AND CIRCUIT ARTICLES COMPRISING A PASSIVE ELECTRICAL ARTICLE

(75) Inventors: Nelson B. O'Bryan, Woodbury, MN (US); Robert R. Kieschke, Woodbury, MN (US); Joel S. Peiffer, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/898,731

(22) Filed: Jul. 3, 2001

(65) Prior Publication Data

US 2001/0038906 A1 Nov. 8, 2001

Related U.S. Application Data

(62) Division of application No. 09/241,817, filed on Feb. 1, 1999, now Pat. No. 6,274,224.

(51) Int. Cl.[7] .............................. C23C 18/54
(52) U.S. Cl. ................... 148/527; 148/536; 148/537; 427/79; 427/101
(58) Field of Search .................... 148/527, 535, 148/536, 537; 427/79, 80, 101, 102, 103

(56) References Cited

U.S. PATENT DOCUMENTS 5,010,641 A   4/1991  Sisler ..................... 29/830

(List continued on next page.)

FOREIGN PATENT DOCUMENTS

| EP | 0 008 107 | 2/1980 |
| EP | 0 902 048 A1 | 3/1999 |
| JP | S58-44789/1983 | 3/1983 |
| JP | S62-163387 | 7/1987 |
| JP | H1-100998 | 4/1989 |
| JP | H1-292895 | 11/1989 |
| JP | H2-65194/1990 | 3/1990 |
| JP | H3-500593/1991 | 2/1991 |
| JP | H3-136396/1991 | 6/1991 |
| JP | H4-361565/1992 | 12/1992 |
| JP | H6-37256 | 2/1994 |
| JP | H6-90086 | 3/1994 |
| JP | H6-104578 | 4/1994 |
| JP | H6-125180 | 5/1994 |
| JP | H6-252460 | 9/1994 |
| JP | H6-297634 | 10/1994 |
| JP | H6-318597 | 11/1994 |
| JP | H7-30257 | 1/1995 |
| JP | H7-30258 | 1/1995 |
| WO | WO 94/29897 | 12/1994 |

OTHER PUBLICATIONS

IPC Test Method Manual, IPC–TM–650, test No. 2.4.9, Oct. 1988, published by The Institute for Interconnecting and Packaging Electronic Circuits.

(List continued on next page.)

Primary Examiner—George Wyszomierski
(74) Attorney, Agent, or Firm—Bradford B. Wright

(57) ABSTRACT

A passive electrical article comprising (a) a first self-supporting substrate having two opposing major surfaces, (b) a second self-supporting substrate having two opposing major surfaces, and (c) an electrically insulating or electrically conducting layer comprising a polymer and having a thickness ranging from about 0.5 to about 10 μm between the first and second substrate, wherein a major surface of the first substrate in contact with the layer and a major surface of the second substrate in contact with the layer have an average surface roughness ranging from about 10 to about 300 nm and wherein a force required to separate the first and second substrates of the passive electrical article at a 90 degree peel angle is greater than about 3 pounds/inch (about 0.5 kN/m), a printed wiring board or a flexible circuit comprising the passive electrical article, an electrical device comprising the printed wiring board or the flexible circuit comprising the passive electrical article, and a method of manufacturing the passive electrical article.

3 Claims, 4 Drawing Sheets

U.S. PATENT DOCUMENTS

| | | | | |
|---|---|---|---|---|
| 5,027,253 | A | 6/1991 | Lauffer et al. | 361/321 |
| 5,079,069 | A | 1/1992 | Howard et al. | 428/209 |
| 5,155,655 | A | 10/1992 | Howard et al. | 361/303 |
| 5,161,086 | A | 11/1992 | Howard et al. | 361/321 |
| 5,162,977 | A | 11/1992 | Paurus et al. | 361/401 |
| 5,172,304 | A | 12/1992 | Ozawa et al. | 361/401 |
| 5,183,972 | A | 2/1993 | Duane et al. | 174/251 |
| 5,261,153 | A | 11/1993 | Lucas | 29/830 |
| 5,469,324 | A | 11/1995 | Henderson et al. | 361/301.2 |
| 5,686,703 | A | 11/1997 | Yamaguchi | 174/259 |
| 5,701,032 | A | 12/1997 | Fischer et al. | 257/692 |
| 5,714,252 | A | 2/1998 | Hogerton et al. | 428/344 |
| 5,745,334 | A | 4/1998 | Hoffarth et al. | 361/313 |
| 5,796,587 | A | 8/1998 | Lauffer et al. | 361/763 |
| 6,174,337 | B1 * | 1/2001 | Keenan | 427/80 |
| 6,274,224 | B1 * | 8/2001 | O'Bryan et al. | 428/209 |

OTHER PUBLICATIONS

"A Novel Integrated Decoupling Capacitor for MCM–L Technology", Premjeet Chahal, Rao R. Tummala, Mark G. Allen and Madhavan Swaninathan; 1996 Electronic Components and Technology Conference, pp. 125–132.

"A Novel Integrated Decoupling Capacitor for MCM–L Technology", Premjeet Chahal, Rao R. Tummala, Mark G. Allen and Madhavan Swaminathan; *IEEE Transactions on Components, Packaging, and Manufacturing Technologyu*, Part B, vol. 21, No. 2, May 1998, pp. 184–192.

*Handbook of Polymer Coatings for Electronics*, James Licari, Noyes Publication 1990, pp. 374–381.

"Integrated Capacitors Using Polymer–Ceramic Composites for MCM–L", Premjeet Chahal, Rao R. Tummala and Mark G. Allen, ISHM '96 Proceedings, pp. 126–131.

"Improvements and Recent Advances in Nanocomposite Capacitors Using a Colloidal Technique", Vishal Agarwal, Premjeet Chahal, Rao R. Tummala and Mark G. Allen; Packaging Research Center, Electrical and Computer Engineering, Georgia Institute of Technology, Atlanta, GA 30332–0560, date unknown.

"Barium Titanate/Epoxy Composite Dielectric Materials for Integrated Thin Film Capacitors", Shurong Liang, Seung R. Chong and Emmanuel P. Giannelis, Department of Materials Science and Engineering, Cornell University, Ithaca, NY 14853–1501, date unknown.

* cited by examiner

PASSIVE ELECTRICAL ARTICLE, CIRCUIT ARTICLES THEREOF, AND CIRCUIT ARTICLES COMPRISING A PASSIVE ELECTRICAL ARTICLE

This is a divisional of application Ser. No. 09/241,817 filed Feb. 1, 1999, now U.S. Pat. No. 6,274,224.

This invention is based on government sponsored research as part of Contract Number N66001-96-C-8613 issued by Naval Command, Control and Ocean Surveillance Center, RDT & E Division under Planar Capacitor Layer For Mixed Signal MCMs Project. The U.S. government may have certain rights in this invention.

FIELD OF THE INVENTION

This invention relates to a passive electrical article, circuit articles thereof, and circuit articles comprising the passive electrical article. The passive electrical article comprises at least two self-supporting substrates having an electrically insulating or electrically conducting layer between the substrates.

BACKGROUND OF THE INVENTION

A continuing trend in the electronics industry is the miniaturization of electronic circuits, and the drive toward higher and higher circuit element density. On conventional printed wiring boards today, a large fraction of the surface area is occupied by surface-mounted capacitors and other passive devices. The industry has recognized that one way to further increase circuit element density is to eliminate surface-mounted passives and embed or integrate passive structures in the circuit boards themselves. This has the added advantage of placing the capacitors much closer to the active components, thus reducing electrical lead length and lead inductance, thereby improving circuit speed and reducing signal noise. Examples of embedded or integrated capacitor articles are disclosed in U.S. Pat. Nos. 5,010,641; 5,027,253; 5,079,069; 5,155,655; 5,161,086; 5,162,977; 5,261,153; 5,469,324; 5,701,032; 5,745,334; and 5,796,587.

A basic capacitor construction consists of two electrically conductive electrodes separated by a thin layer of electrically insulating dielectric material. In present embedded capacitor technologies, the dielectric material is typically an anodized or sputter-deposited metal oxide, such as tantalum oxide, or a high dielectric constant ceramic, such as barium titanate, dispersed in a matrix of some thermally and mechanically stable polymer, such as an epoxy.

It is known that for the polymer-based capacitors to have satisfactory mechanical strength and interlayer adhesion, the metal electrodes must have rough surfaces. These rough surfaces limit the minimum thickness possible without creating short circuits ("shorts") and high leakage currents across the capacitor structure, since otherwise, random protrusions on the two facing electrode surfaces could bridge the gap across the dielectric layer and make contact.

Capacitance, C, of a parallel plate capacitor is given by the equation: $C=KA/4\pi d$, where K represents the dielectric constant of the medium between the plates, A represents the area of the plates, and d represents the distance between the plates. Accordingly, capacitance per unit area (measured typically in $nF/cm^2$) can only be increased by reducing the dielectric layer thickness (electrode spacing) of the capacitor or increasing the dielectric constant of the dielectric material between the conductive electrodes. Thus, it was believed that a higher capacitance per unit area, which is increasingly required for modern high frequency, high speed circuits, could only be achieved in polymer-based capacitors by using dielectrics with unusually high dielectric constants.

It is well known that capacitors can be formed by placing a layer of a high dielectric constant ceramic dispersed in an organic polymer between two conductive electrode sheets, e.g., barium titanate in epoxy between copper foils. Such capacitor sheets or laminates can be used as a layer in printed wiring boards and multichip modules to replace surface mounted discrete capacitors. Such capacitor sheets are currently sold; however, they have low capacitance (typically less than 1 $nF/cm^2$) which limits their usefulness. Two well known ways of increasing the capacitance of such a laminate are to decrease the coating thickness and to increase the dielectric constant. To be useful, coating thicknesses typically need to be in range of 1 to 10 micrometers ($\mu m$) with a ceramic volume loading of approximately 50%. Commercially available capacitor laminates have a 50 to 100 $\mu m$ thick dielectric layer.

SUMMARY OF THE INVENTION

The industry continues to seek a capacitor article possessing mechanical strength and chemical resistance sufficient to withstand circuit fabrication and handling processes; dielectric layers with high dielectric constants which are stable over wide frequency and temperature ranges; thin dielectric layers to achieve the high capacitance sometimes needed; and low direct current (DC) leakage current, low loss and high breakdown characteristics, which do not have DC electrical contact or "short circuits" across the appreciably large dielectric layer areas (e.g. several square centimeters) and which are unaffected by environmental conditions used in service or qualification testing.

The drive toward reducing circuit size and minimizing lead inductance has also spurred an interest in developing similar articles with resistive function.

The present invention is directed to a passive electrical article, such as a capacitor or resistor, which may be embedded or integrated within a circuit or which may function as an electrical circuit.

In one embodiment, the present invention relates to a passive electrical article comprising (a) a first self-supporting substrate having two opposing major surfaces, (b) a second self-supporting substrate having two opposing major surfaces, and (c) an electrically insulating or electrically conducting layer comprising a polymer and having a thickness ranging from about 0.5 to about 10 $\mu m$ between the first and second substrate. A major surface of the first substrate in contact with the layer and a major surface of the second substrate in contact with the layer have an average surface roughness ranging from about 10 to about 300 nm. A force required to separate the first and second substrates of the passive electrical article at a 90 degree peel angle is greater than about 3 pounds/inch (about 0.5 kN/m).

The passive electrical article may be patterned to form an electrical circuit or may further comprise an electrical contact to form an electrical circuit. In addition, the present invention relates to a printed wiring board or a flexible circuit comprising the passive electrical article as well as to an electrical device comprising a printed wiring board or a flexible circuit which comprises the passive electrical article.

The present invention also relates to a method of manufacturing a passive electrical article comprising the steps of: (1) providing a first metal substrate, having two opposing major surfaces, substantially free of debris or chemisorbed or adsorbed materials and a second metal substrate, having two opposing major surfaces, substantially free of debris or chemisorbed or adsorbed materials, (2) providing a blend comprising a resin, (3) coating the blend onto a first major surface of the first substrate so that the blend, after curing or drying, forms a layer having a thickness ranging from about 0.5 to about 10 µm, (4) laminating the first major surface of the second substrate or a first major surface of the second substrate coated with the blend onto the first major surface of the first substrate, and (5) curing or drying the blend. The first and second substrates may be annealed before step (2) or as a consequence of step (5). The first major surface of the first substrate and the first major surface of the second substrate have an average surface roughness ranging from about 10 to about 300 nm. A force required to separate the first and second substrates of the passive electrical article at a 90 degree peel angle is greater than about 3 pounds/inch (about 0.5 kN/m).

The present invention is unique because the passive electrical article comprises a relatively thin electrically insulating or electrically conducting layer in combination with relatively smooth substrates and still achieves an adhesion as described herein.

BRIEF DESCRIPTION OF THE DRAWINGS

The present invention will be further explained with reference to the appended Figures, wherein like structure is referred to by like numeral throughout the several views, wherein the thickness of layers is not necessarily to scale, and wherein.

DETAILED DESCRIPTION OF THE INVENTION

The present invention is directed to a passive electrical article, that can function as a capacitor or resistor, which may be embedded or integrated as a component of a circuit, for example, in a PWB or a flexible circuit (flexible circuits are a type of PWB). In addition, the passive electrical article itself, with some modifications, can function as an electrical circuit.

Passive Electrical Article

A passive electrical article of the present invention comprises a first self-supporting substrate having two opposing major surfaces, a second self-supporting substrate having two opposing major surfaces, and an electrically insulating or electrically conducting layer (also referred to throughout as "the layer") between the first and second substrate, which acts to adhere the two substrates. To form a capacitor, the layer is electrically insulating; to form a resistor, the layer is electrically conductive.

Figure 1A:
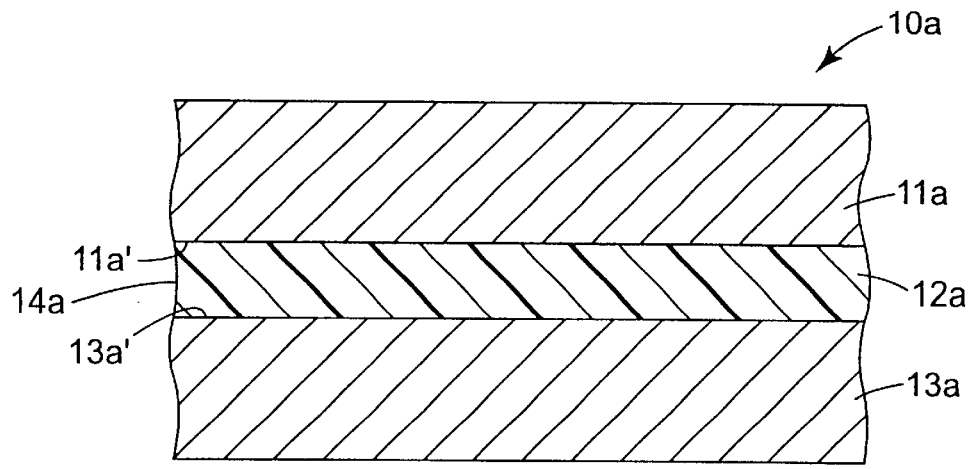
FIGS. 1A and 1B are cross-sectional views of a passive electrical article of the present invention, which can function as a capacitor or resistor.
Figure 1B:
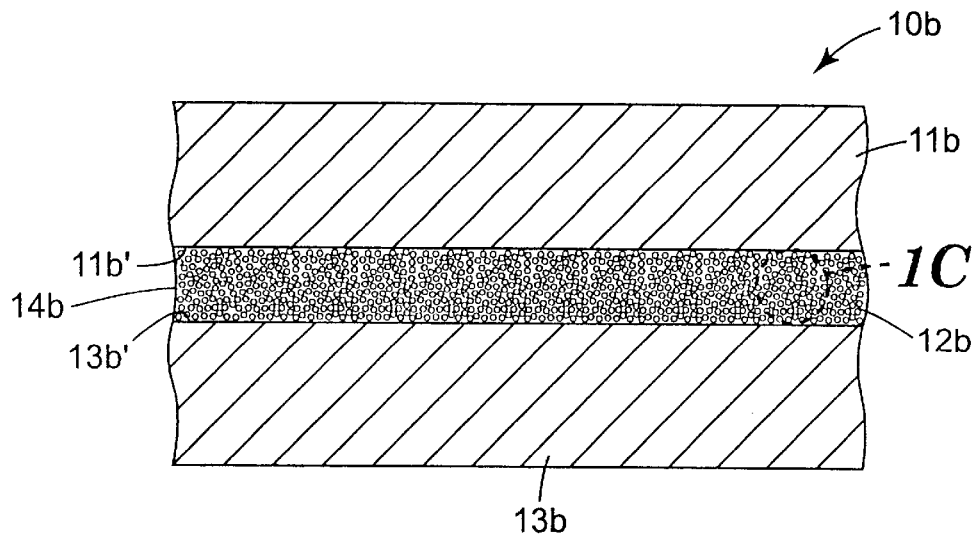
Figure 1C:
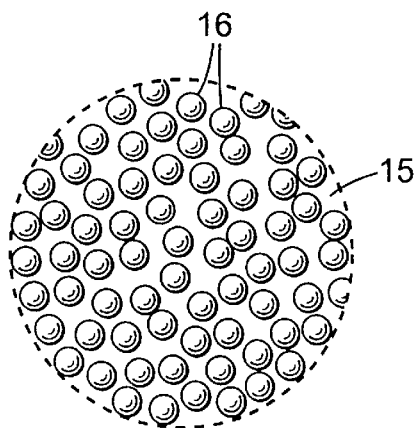
FIG. 1C is an expanded view of the electrically insulating or electrically conducting layer in FIG. 1B.

Applications for a passive electrical article of the present invention that functions as a capacitor or a resistor are varied and the range of desired capacitance or resistance varies according to the application. FIGS. 1A and 1B illustrate a passive electrical article 10a and 10b of the present invention that may function as a capacitor or resistor. Passive electrical article 10a comprises first substrate 11a, second substrate 13a, and electrically insulating or electrically conducting layer 12a. Passive electrical article 10b comprises first substrate 11b, second substrate 13b, and electrically insulating or electrically conducting layer 12b. Layer 12b contains a plurality of particles 16 in a polymer 15, as shown in expanded FIG. 1C. The particles may or may not connect to each other and may be arrayed in a predetermined manner, for example, uniformly, or randomly, depending on the desired end application.

Major surface 11a' of first substrate 11a, or major surface 11b' of first substrate 11b, must conductive to form a capacitor or a resistor. Major surface 13a' of second substrate 13a, or major surface 13b' of second substrate 13b, must be conductive to form a capacitor, but may be either insulative or conductive to form a resistor, depending on whether the intended direction of current flow is transverse to electrically insulating or electrically conducting layer 12a or 12b, respectively, as in the capacitor case, or in the plane of electrically insulating or electrically conducting layer 12a or 12b, respectively.

In FIG. 1A or 1B, if the passive electrical article is a resistor, then the layer will be electrically conducting and if transverse current flow through the resistor is desired, at least a portion of major surface 13a' or 13b' in contact with electrically conducting layer 12a or 12b, respectively, is conductive. If resistor current flow in the plane of electrically conducting layer 12a or 12b is intended, current input and output contacts (not shown) will be at first substrate 11a or 11b, respectively, or, optionally, at he lateral surfaces 14a and 14b of electrically conducting layer 12a or 12b, respectively, and second substrate 13a or 13b is preferably an insulative nonconductor.

Figure 2:
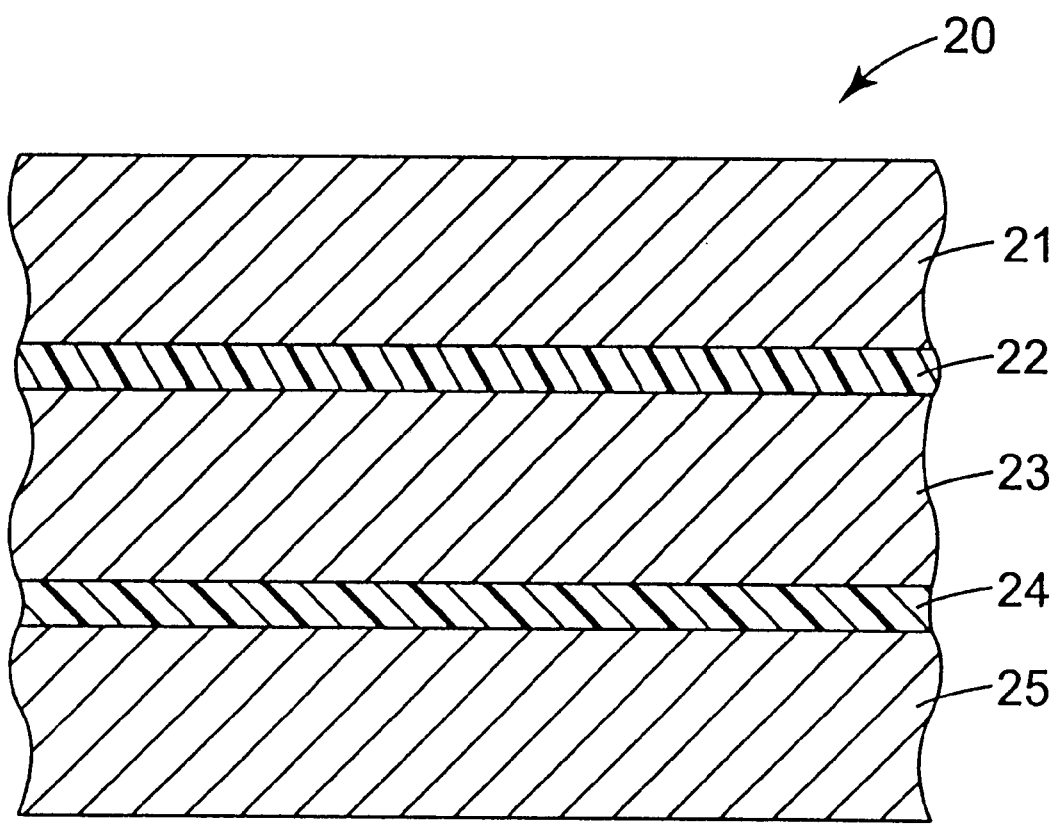
FIG. 2 is a cross-sectional view of a multilayer passive electrical article of the present invention that has capacitive and resistive functions.

FIG. 2 illustrates an example of a passive electrical article of the present invention having more than two substrates and more than one electrically insulating or electrically conducting layer that, in this case, has utility as a resistor in series with a capacitor. Passive electrical article 20 comprises a first substrate 21 that is, for example, conductive; an electrically conductive layer 22 having a plurality of particles (not shown); a second substrate 23 that is, for example, conductive an electrically insulating layer 24 having a plurality of particles (not shown); and a third substrate 25 that is, for example, conductive.

A force required to separate the first and second substrates of the passive electrical article at a 90 degree peel angle is greater than about 3 pounds/inch (about 0.5 kiloNewtons/meter (kN/m)), preferably greater than 4 pounds/inch (0.7 kN/m), more preferably than 6 pounds/inch (1 kN/m), as measured according to the IPC Test Method Manual, IPC-TM-650, test number 2.4.9 dated October 1988, as published by the Institute for Interconnecting and Packaging Electronic Circuits. If more than two substrates are present in a passive electrical article of he present invention, this force is required to separate any pair of substrates separated by an electrically insulating or electrically conducting layer.

Substrate

A substrate of the passive electrical article may comprise a single layer or a plurality of layers, or example, a laminate. A substrate may comprise graphite; composites such as silver particles in a polymer matrix; metal such as copper or aluminum; combinations thereof, or laminates thereof. An example of a multilayer substrate includes copper on polyimide. The first and second substrates may be the same or different.

A substrate in accordance with the present invention is self-supporting. The term "self-supporting substrate" refers to a substrate having structural integrity such that the substrate is capable of being coated and handled without a carrier for support. It is preferable that a substrate is flexible; however, rigid substrates may also be used.

Typically, the major surface of the first substrate in contact with the electrically insulating layer and the major surface of the second substrate in contact with the electrically insulating layer are electrically conductive when forming a capacitor. Surface treatment, which adds material to these major surfaces by, for example, oxidation or reaction with a coupling agent, for example, silanes terminated with functional groups, may be used to promote adhesion. The resulting material on the major surface of the substrate itself may not necessarily be conductive but a capacitor is formed provided the substrates themselves are conductive.

Typically, the major surface of the first substrate in contact with the electrically conducting layer is electrically conductive and the major surface of the second substrate in contact with the eclectically conducting layer is either electrically conductive or electrically non-conductive when forming a resistor, depending on whether transverse or in-plane current conduction through the resistive intermediate layer is desired. These major surfaces may also be surface treated as described with reference to forming a capacitor, and a resistor is formed provided the first substrate is electrically conductive and the second substrate is either electrically conductive or electrically non-conductive.

The major surface of the first substrate in contact with the electrically insulating or electrically conducting layer and the major surface of the second substrate in contact with the electrically insulating or electrically conducting layer have an average surface roughness ranging from about 10 to about 300 nm, preferably 10 to 100 nm, more preferably 10 to 50 nm. If the electrically insulating or electrically conducting layer thickness is 1 μm or less, the average surface roughness preferably ranges from 10 to 50 nm. Average surface roughness, RMS, is measured by taking the square root of the average, $[(z_1)^2+(z_2)^2+(z_3)^2+\ldots(z_n)^2]/n$, where z is a distance above or below the substrate surface mean and n is the number or points measured and is at least 1000. The area measured is at least 0.2 mm². Preferaly, no $z_n$ is greater than half the thickness of the electrically insulating or electrically conducting layer.

Preferably, a substrate has a thickness ranging from 0.5 to 3 mils (approximately 10 to 80 μm), more preferably 0.5 to 1.5 mils (approximately 10 to 38 μm).

When the substrate is a metal, he metal preferably has an anneal temperature which is at or below the temperature for curing the electrically insulating or electrically conducting layer or the metal is annealed before the electrically insulating or electrically conducing layer is coated.

A preferred substrate is copper. Exemplary copper includes copper foil available from Carl Schlenk, AG, Nurnberg, Germany.

Electrically Insulating or Electrically Conducting Layer

An electrically insulating or electrically conducting layer of the passive electrical article, which may comprise one or more layers, comprises a polymer. Preferably, the electrically insulating or electrically conducting layer comprises a polymer and a plurality of particles an is prepared from a blend of resin and particles.

The electrically insulating or electrically conducting layer, with regard to the substrate material and substrate surface roughness, is selected to provide a passive electrical article that requires a force described above to separate the first and second substrates. If more than two substrates are present in a passive electrical article of the present invention, then more than one electrically insulating or electrically conducting layer may be present and each of the electrically insulating or electrically conducting layers are selected to provide this adhesion.

Suitable resins for the electrically insulating or electrically conductive layer, which can be used to form a capacitor or a resistor, include epoxy, polyimide, polyvinylidene fluoride, cyanoethyl pullulan, benzocyclobutene, polynorbornene, polytetrafluoroethylene, acrylates, and blends thereof. Commercially available epoxies include those available from Shell Chemical Company, Houston, Tex., under the trade designation "Epon 1001F" and "Epon 1050." Preferably, the resin can withstand a temperature that would be encountered in a typical solder reflow operation, for example, in the range of about 180 to about 290° C. These resins may be dried or cured to form the electrically insulating or electrically conducting layer.

Exemplary bends include blends of epoxies, preferably a blend of a diglycidylether of bisphenol A and a novalac epoxy, for example, 90 to 70% by weight "Epon 1001F" and 10 to 30% by weight "Epon 1050" based on the total weight of the resin.

When particles are present, the particles may be dielectric (or insulating) particles or conductive particles or mixtures thereof. Particle distribution may be random or ordered. Typically, a passive electrical article designed to function as a capacitor comprises dielectric or insulating particles. A passive electrical article designed to function as a resistor may comprise conductive particles in an electrically conducting resin or in an electrically insulating resin or dielectric particles in an electrically conducting resin. As mentioned above, mixtures of particles are suitable provided that he overall effect of the resin layer is insulative for a capacitor and conductive for a resistor.

Exemplary dielectric or insulating particles include barium titanate, barium strontium titanate, titanium oxide, lead zirconium titanate, and mixtures thereof. A commercially available barium titanate is available from Cabot Performance Materials, Boyertown, Pa., under the trade designation "BT-8".

Exemplary conductive particles may comprise conductive or semiconductive materials such as metal or metal alloy particles where the metal may be silver, nickel, or gold; nickel-coated polymer spheres; gold-coated polymer spheres (commercially available from JCI USA Inc., New York, N.Y., under product designation number "20 GNR4.6-EH"); graphite tantalum nitrides such as TaN or $Ta_2N$; tantalum oxynitride ($TaN_xO_y$); doped silicon; silicon carbide; metal silicon nitrides, such as $MSiN_x$ where M is a transition metal such as Ta, Ti, Cr, Mo, or Nb; or mixtures thereof.

The particles may be any shape and may be regularly or irregularly shaped. Exemplary shapes include spheres, platelets, cubes, needles, oblate, spheroids, pyramids, prisms, flakes, rods, plates, fibers, hips, whiskers, and mixtures thereof.

The particle size, i.e., the smallest dimension of the particle, typically ranges from about 0.05 to about 11 $\mu$m, preferably 0.05 to 0.3 $\mu$m, more preferably 0.05 to 2 $\mu$m. Preferably, for capacitors or for resistors using in-plane conduction, the particles have a size allowing at least two to three particles to be stacked vertically within the electrically insulating or electrically conducting layer thickness. A relatively large conductive particle, i.e., having a particle size slightly larger than the final coating thickness of the electrically conducting layer allows individual conductive particles to bridge the gap between two conductive substrates when the resistor is used in the transverse conduction mode, that is, where current crosses the electrically conducting layer transversely. During lamination, these relatively large particles will cause a compressive force leading to surface deformation and a "wiping" action at the particle-substrate interface, which may remove surface oxide layers. In addition, a good electrical contact may be provided that my remain stable during temperature cycling of the cured resin layer despite the difference in thermal expansion coefficients between the particles and the resin matrix. This effect is described in U.S. Pat. Nos. 5,686,703 and 5,714,252, as well as copending application U.S. Ser. No. 08/685,125 (also published as WO 98/04107), which are incorporated herein by reference.

The loading of particles in the polymer is typically 20 to 60% by volume, preferably 30 to 55% by volume, more preferably 40 to 50% by volume, based on the total volume of the electrically insulating or electrically conducting layer.

Typically, the thickness of the electrically insulating or electrically conducting layer (comprising one or more layers) ranges from about 0.5 to about 10 $\mu$m, preferably 1 to 5 $\mu$m, more preferably 1 to 4 $\mu$m.

Method of Manufacturing a Passive Electrical Article

A method for manufacturing a passive electrical article in accordance with the present invention comprises providing a first substrate, having two opposing major surfaces, substantially free of debris or chemisorbed or adsorbed materials, providing a blend comprising a resin, coating the blend onto a first major surface of the first substrate, laminating a second substrate, having two opposing major surfaces, to the blend on the first major surface off the first substrate, and curing or drying the blend. Alternatively, the second substrate may contain a blend comprising a resin on its first major surface and the first and second substrates may be laminated together to connect the first major surface of each of the first and second substrate, i.e., laminating the blend-coated side of each substrate together. Preferably, as descried above, at least one of the first and second conductor substrate comprises an electrical conductor, such as a metal.

The substrate is preferably substantially free of debris or chemisorbed or adsorbed materials in order to maximize adhesion with the electrically insulating layer. This is achieved, or example, by reducing the amount of residual organics on the substrate surface and removing debris from the substrate surface. Exemplary methods include surface treatment as described below.

the steps of the present invention are described in additional detail with reference to preparing a capacitor comprising copper foil as the first and second substrates and an electrically insulating layer formed from epoxy and barium titanate particles.

The copper foil, which may have material present on its surface such as an organic anti-corrosion agent (for example, a benzotriazole derivative) and the residual oils from the rolling process, is subjected to a surface treatment, for example, to ensure good adhesion between the electrically insulating layer and the copper foil substrates. Removal can be affected by, for example, treating the foil with an argon-oxygen plasma or with an air corona, or wet chemical treatment can be used as well understood in the art. Particulates adhering to both sides of the foil can be removed using, for example, an ultrasonic/vacuum web cleaning device commercially available from Web Systems Inc., Boulder, Colo., under the trade designation "Ultracleaner". Preferably, the copper foil is not scratched, dented, or bent during this surface treatment step in order to avoid possible coating problems and coating defects which may result in non-uniform coating or shorted articles, such as shorted capacitors.

The blend may be prepared by providing a resin such as epoxy, optionally a plurality of dielectric or insulating particles such a barium titanate, and optionally a catalyst. Adsorbed water or residual materials on the particles; e.g., carbonates, resulting from the manufacturing process an be removed from the surface of the particles before use. Removal may be accomplished by heating the particles in air at a particular temperature for a certain period of time, for example, 350° C. for 15 hours. After heating, the particles may be stored in a dessicator before use in the blend.

The blend of barium titanate particles an epoxy may be prepared by mixing to ether barium titanate, a ketone solution of epoxies, and a dispersing agent. Typically, a high shear rotor-stator mixer running at 6000 rpm and with the mixture cooled with a water/ice bath is used. Conventional ball-milling is another exemplary method. The blend is allowed to sit undisturbed allowing agglomerates to settle to the bottom of the container, so that the filter will not be clogged in the subsequent step. Typically, the settling is allowed to occur for about 12 hours or more. Alternatively, the blend can be filtered through a coarse filter, for example, which has a mesh size about ten times the mesh size used in the final filtration step. As a final filtration step, the blend is then filtered, for example, through a stainless steel mesh filter or equivalent having a mesh size of about 2 to about 5 $\mu$m. The filtered blend is analyzed for percent solids and barium titanate/epoxy ratio. The desired composition is obtained by adding additional filtered solvent and/or epoxy. The blend may be coated in a solvent system or solvent may be omitted if the organic binder is a liquid with sufficiently low viscosity to enable coating.

The blend may contain additives such as a dispersant, preferably an anionic dispersant when an electrically insulating layer is desired, and solvents. Examples of dispersants include, for example, a copolymer of polyester and polyamine, commercially available from ICI Americas, Wilmington, Del., under the trade designation "Hypermeer PS3". Examples of solvents, for example, include methyl ethyl ketone and methyl isobutyl ketone, both of which are commercially available from Aldrich Chemical, Milwaukee, Wis. In the preferred system, other additives are not required; however, additional components such as agents to change viscosity or to produce a level coating can be used.

A catalyst or curing agent may be added to the blend. If a catalyst or curing agent is used, the catalyst or curing agent an be added before the coating step. Preferably, the catalyst or curing agent is added just before the coating step.

Exemplary catalysts include amines and imidazoles. If particles having a basis surface, i.e., having a pH of greater than 7, are not present, then exemplary catalysts can include those producing acidic species, i.e., having a pH of less than 7, such as sulfonium salts. A commercially available catalyst is 2,4,6-tris)dimethylaminomethyl)phenol commercially available from Aldrich Chemical Milwaukee, Wis. Typically, a catalyst is used in an amount ranging from about 0.5 to about 8% by weight, preferably 0.5 to 1.5% based on the weight of resin. When 2,4,6-tris)dimethylaminomethyl) phenol is used, the % by weight based on the weight of resin is preferably 0.5 to 1%.

Exemplary curing agents include polyamines, polyamides, polyphenols and derivatives thereof. A commercially available curing agent is 1,3-phenylenediamine, commercially available from E. I. DuPont de Nemours Company, Wilmington, Del. Typically, a curing agent is used in an amount ranging from about 10 to about 100% by weight, preferably 10 to 50% by weight, based on the weight of resin.

The cleaned copper foil is coated with the blend using any suitable method, for example, a gravure coater. Preferably, coating is performed in a cleanroom to minimize contamination. The dry thickness depends on the percent solids in the blend, the relative speeds of the gravure roll and the coating substrate, and on the cell volume of the gravure used. Typically, to achieve a dry thickness in the range of about 0.5 to about 2 $\mu$m, the percent solids are in the range of 20 to 60% by weight. The coating is dried to a tack-free state in the oven of the coater, typically at a temperature of less than about 100° C., preferably the coating is dried in stages starting with a temperature of about 30° C. and ending with a temperature of about 100° C., and then wound onto a roll. Higher final drying temperatures, e.g., up to about 200° C. can be used, but are not required. Generally, very little cross-linking occurs during the drying step; its purpose is primarily to remove as much solvent as possible. Retained solvent may lead to blocking (i.e., unwanted interlayer adhesion) when the coating is stored on a roll and to poor adhesion for the laminate.

Coating techniques to avoid defects include in-line filtration and deaeration (to remove air bubbles) of the coating mixture. In addition, it is preferable, before laminating two substrates coated with an electrically insulating layer, that at least one of the electrically insulating or electrical conducting layers is partially cured, preferably in air, if a resin requiring curing is used. In articular, adhesion of the substrate may be improved by heat treating the coating before lamination. The time for heat treatment is preferably short, for example, less than about 10 minutes, particularly at higher temperatures.

Lamination is preferably carried out using two of the coated substrates descried above. One of the coated substrates may go through an oven before reaching he laminator, for example, at a temperature ranging from about 150 to about 180° C. for about 2 to about 10 minutes. This preliminary heating step can be done on one or both of the coated substrates. If heating is used for longer than 5 minutes, heating is performed on only one coated substrate. Preferably, the electrically insulating layer should not touch anything during lamination and lamination should be done in a cleanroom. To make a passive electrical article of the present invention, he coated substrates are laminated, electrically insulating or electrically conducting layer to electrically insulating or electrically conducting layer, using a laminator with two nip rollers heated to a temperature ranging from about 150 to about 200° C., preferably about 150° C. Suitable air pressure is supplied to the laminator rolls, preferably at a pressure ranging from 5 to 40 psi (34 to 280 kPa), preferably 15 psi (100 kPa). The roller speed can be set at any suitable value and preferably ranges from 12 to 36 inches/minute (0.5 to 1.5 cm/second), more preferably 15 inches/minute (0.64 cm/second). This process can be conducted in a batch mode as well.

The laminated material can be cut into sheets of the desired length or wound onto a suitable core. Once lamination is complete, the preferred cleanroom facilities are not longer required.

When the resin requires curing, the laminated material is then cured. Exemplary curing temperatures include temperatures ranging from about 140 to about 200° C., preferably 140 to 170° C. and exemplary curing times include a period ranging from about 60 to about 150 minutes, preferably 60 to 100 minutes.

Adhesion of the electrically insulating or electrically conducting layer to a metal substrate may be enhanced if the metal is sufficiently soft at the time of coating or becomes soft during lamination and/or cure; i.e., the foil is annealed before coating or becomes annealed during subsequent processing. Annealing may be accomplished by heating the substrate before the coating step or as a result of the curing or drying step if the metal anneal temperature is at or lower than the cure temperature of the resin. It is preferred to use a metal substrate with an anneal temperature below the temperature at which curing or drying and lamination occur. Annealing conditions will vary depending on the metal substrate used. Preferably, in the case of copper, at either of these sages in the press, the metal substrate obtains a Vickers heardness, using a 10 g load, of less than about 85 kg/mm$^2$. A prefeffer temperature range for copper to achieve this hardness ranges from about 100 to about 180° C., more preferably 120 to 160° C.

A resistor article may be made by using semiconductive or conductive particles such as silver particles; nickel particles; nickel-coated polymer spheres; gold-coated polymer spheres (e.g., 20 GNR4.6-EH from JCI USA Inc.); tin solder balls; higher resistivity materials such as graphite, tantalum nitrides such as TaN or Ta$_2$N; tantalum oxynitride (TaN$_x$O$_y$); metal silicon nitrides (MSiN$_x$) where M is a transition metal such as Ta, Ti, Cr, Mo, or Nb; or semiconductors when higher resistance is desired; and mixtures thereof.

The coating thickness of the electrically insulating or electrically conducting layer is preferably approximately equal to or greater than the particle thickness. The particles may be large enough that each particle contacts both substrates after lamination, providing transverse current conduction between the two conductive substrates. Alternatively, a high volume fraction loading of smaller conductive particles may be used, such that chains of touching particles making electrical contact between the desired current input and output contacts on the conductive portions of the substrates. This approach may be used for either transverse or in-plane current conduction configurations. If the resistor is to be used in a transverse conduction configuration (with current flowing between the two substrates through the layer), both substrates must be electrically conductive on the major surface, which contacts the layer containing the conductive particles. If the resistor is to be used in an in-plane conductive configuration, only one substrate need have a conductive surface. The conductive surface can be patterned after lamination to provide electrically separated current input and output portions, which are electrically connected through the layer containing the conductive particles.

Although a passive electrical article of the present invention can be functional as it is fabricated, the passive electrical article may preferably be patterned as described below, for example, to form discrete islands or removed regions in order to limit lateral conductivity. The patterned passive electrical article may be used as a circuit article itself or as a component in a circuit article, as described below.

Patterning

A surface oft he first or second substrate of the passive electrical article that is accessible may be contacted, for example, by an electrical trace, to make electrical contact so that the first or second substrate acts as an electrode. In addition, it may be desirable to make electrical contact with the major surface of the first or second substrate in contact with the electrically insulating or electrically conducting layer or to provide a through hole contact. Through hole contacts are useful when no interaction with the passive electrical device is desired. In order to reach the major surface of the first or second substrate in contact with the electrically insulating or electrically conducting layer or to provide a through hole contact, the passive electrical article may be patterned.

Any suitable patterning technique known in the art may be employed. For example, patterning of the passive electrical article may be performed by photolithography and/or by laser ablation as is well known in the art.

Photolithography may be performed by applying a photoresist to the passive electrical article, which is then exposed and developed to form a pattern to concealed and exposed substrate areas on the passive electrical article. If the passive electrical article is then exposed to a solution known to chemically attack or etch the substrate, selected areas of the substrate can be removed. A stripping agent, such as potassium hydroxide, is then employed to remove the remaining areas of photoresist. This process allows areas of substrate to be removed that are not desired in the circuit structure.

Laser ablation may be performed by using a laser to selectively thermally remove material from the passive electrical article, for example, from the electrically insulating or electrically conducting layer. Photolithography and laser ablation may be used in combination.

The thickness of the electrically insulating or electrically conducting layer may limit how the passive electrical article of the present invention can be patterned because the layer itself may not mechanically support the substrates. The electrodes may be patterned so that at least one of the substrates will always support the passive electrical article. The first substrate of the passive electrical article may be patterned and the second substrate may remain continuous (or unpatterned) so that the passive electrical article has "structural integrity", i.e., the article is capable of being handled without a carrier for support and remains freestanding. Typically, the passive electrical article is double patterned, i.e., patterned on both sides, without the use of a support, provided the passive electrical article has structural integrity.

Circuit Article

The passive electrical article of the present invention itself may function as a circuit article, with some modification. In one instance, the passive electrical article may be patterned. In this instance, a circuit article may be prepared by providing a passive electrical article of the present invention and patterning the passive electrical article as described above to provide a contact for electrical connection. Either one or both sides of the passive electrical article are patterned to allow access to each major surface of the first and second substrates and to provide a through hole contact.

In another embodiment, a circuit article may be prepared by a method comprising the steps of providing a passive electrical article of the present invention, providing at least one electrical contact, and connecting the contact to at least one substrate of the passive electrical article.

A passive electrical article of the resent invention may further comprise one or more additional layers, for example, to prepare a PWB or flexible circuit. The additional layer may be rigid or flexible. Exemplary rigid layers include fiberglass/epoxy composite commercially available from Polyclad, Franklin, N.H., under the trade designation "PCL-FR-226", ceramic, metal, or combinations thereof. Exemplary flexible layers comprise a polymer film such as polyimide or polyester, metal foils, or combinations thereof. Polyimide is commercially available from duPont under the trade designation "Kapton" and polyester is commercially available from Minnesota Mining and Manufacturing Company (3M), St. Paul, Minn., under the trade designation "Scotchpar". These additional layers may also contain electrically conductive traces on top of the layer or embedded within the layer. The term "electrically conductive traces" refers to strips or patterns of a conductive material designed to carry current. Suitable materials for an electrically conductive trace comprise copper, aluminum, tin solder, silver paste, gold, and combinations thereof.

In this embodiment, a preferred method of making a circuit article comprises the steps of providing a passive electrical article of the present invention, patterning at least one side of the passive electrical article, providing an additional layer, attaching the layer to the passive electrical article, and providing at least one electrical contact to at least one substrate of the passive electrical article. Preferably, a second additional layer is provided and attached to the passive electrical article.

Printed Wiring Boards and Flexible Circuits

A passive electrical article of the present invention can be used in a PWB, for example, a flexible circuit, as a component, which functions as a capacitor and/or a resistor. The passive electrical article may be embedded or integrated in the PWB or flexible circuit.

A PWB typically comprises two layers of material, for example, a laminate of epoxy and fiberglass, which may have one or two copper surfaces, sandwiching a layer of adhesive or prepreg. A flexible circuit typically comprises a flexible layer, for example, a polyimide layer coated with copper, and a layer of adhesive on the polyimide. The position of a passive electrical article of the present invention in any suitable PWB or flexible circuit and the process of embedding or integrating a passive electrical article of the present invention in any suitable PWB or flexible circuit are well understood in the art. Notably, with either a PWB or flexible circuit, care must be taken to align the PWB or flexible circuit layers/components.

As noted above, the thickness of the electrically insulating or electrically conducting layer may determine how the capacitor can be patterned. When the passive electrical article is incorporated in a PWB or flexible circuit, the PWB or flexible circuit layers may lend further support to the passive electrical article allowing for additional unique patterning techniques.

For example, a double patterning and lamination process may be useful. The double patterning and lamination process comprises the following steps that can occur after the photolithographic patterning one of the substrates as described above. In this process, the patterned substrate is laminated to a supportive material such as a circuit board layer, for example, FR4, with the patterned side facing the supportive material. The other substrate can be patterned by an essentially similar technique, since the electrically insulating or electrically conducting layer and the patterned substrates are now fully supported by the supportive material. A second lamination on the exposed side of the second substrate is then conducted to complete the process.

Figure 3A:
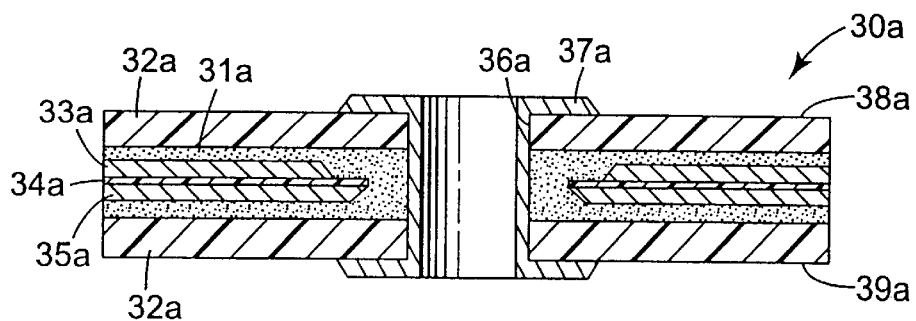
FIGS. 3A, 3B, and 3C are cross-sectional views of a printed wiring board (PWB) incorporating a passive electrical article of the present invention.
Figure 3B:
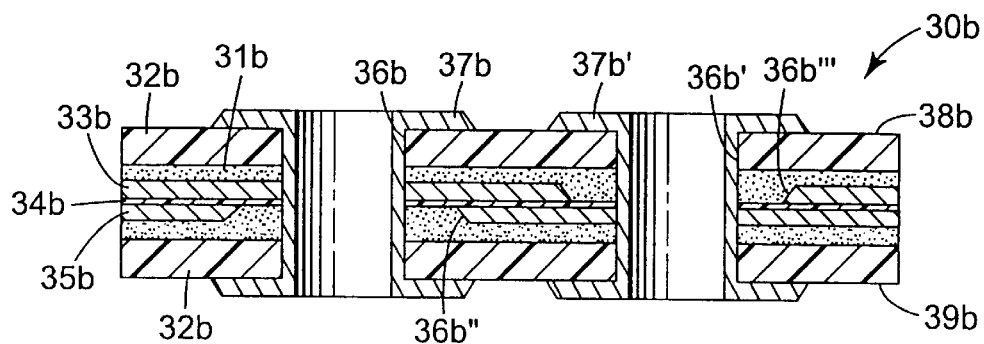

FIGS. 3A and 3B illustrate examples of PWB 30a or 30b, respectively, containing a passive electrical article of FIG. 1a or 1b. PWB 30a or 30b comprise two layers 32a or 32b, respectively, of a material such as epoxy/fiberglass sandwiching a layer of adhesive or prepeg 31a or 31b, respectively, and a passive electrical article of the present invention, which functions as a capacitor or a resistor, illustrated by first substrate 33a or 33b, respectively; electrically insulating or electrically conducting layer ("layer") 34a or 34b; and second substrate 35a or 35b.

Figure 3C:
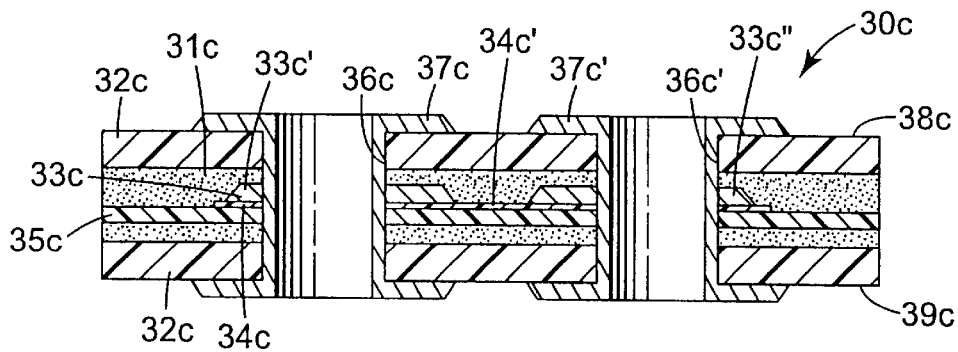

FIG. 3C illustrates an example of PWB 30c containing a passive electrical article of FIG. 1a or 1b. PWB 30c comprises two layers 32c of a material such as epoxy/fiberglass sandwiching a layer of adhesive or prepreg 31c and a passive electrical article of the present invention, which functions as a resistor, comprising first substrate 33c, electrically conducting layer ("layer") 34c, and second substrate 35c which is an insulator.

FIG. 3A illustrates PWB 30a containing a passive electrical article of the present invention, which may function as a capacitor or a resistor, in which a through hole contact is made in order to provide a conductive path from upper surface 38a to lower surface 39a of PWB 30a that avoids contact with the passive electrical article. In FIG. 3A, signals or current are routed through PWB 30a by a hole 36a that is electroplated with copper to form surface copper structure 37a. Surface copper structure 37a routes signals from a trace (not shown) on upper surface 38a of PWB 30a to lower surface 39a of PWB 30a. Surface copper structure 37a runs through hole 36a in first substrate 33a, layer 34a, and second substrate 35a. Thus, in FIG. 3A, signals pass from upper surface 38a of PWB 30a to lower surface 39a of PWB 30a without interacting with first substrate 33a, layer 34a, or second substrate 35a.

FIG. 3B illustrates PWB 30b containing a passive electrical article of the present invention, which may function as a capacitor or a resistor, in which contact is made with the first substrate and, separately, the second substrate to make electrical connection with the capacitor or resistor. In FIG. 3B, signals or current are routed though PWB 30b by hole 36b or hole 36b', which are, electroplated with copper to form surface copper structures 37b and 37b', respectively. Surface copper structures 37b and 37b' route signals from a trace (not shown) on upper surface 38b of PWB 30b to lower surface 39b of PWB 30b. Surface copper structure 37b contacts first substrate 33b but passes through a previously patterned and larger hole 36b" in second substrate 35b, thus allowing a direct connection between surface copper structure 37b and first substrate 33b. Surface copper structure 37b' contacts second substrate 35b but passes through a previously patterned and larger hole 36b'" in first substrate 33b, thus allowing a direct connection between surface copper structure 37b' and second substrate 35b. If layer 34b is an insulator, a capacitive relationship is formed between 37b and 37b' by virtue of the overlap established between first substrate 33b and second substrate 35b. If layer 34b is a conductor, a resistive relationship is formed between 37b and 37b' by virtue of the overlap established between first substrate 33b and second substrate 35b.

FIG. 3C illustrates PWB 30c containing a passive electrical article of the present invention, which functions as a resistor, in which signal conduction in the plane of the layer is desired. In FIG. 3C, signals or current are routed through PWB 30c by hole 36c or hole 36c', which are, electroplated with copper to form surface copper structures 37c and 37c', respectively. Surface copper structures 37c and 37c' route signals from a trace (not shown) on upper surface 38c of PWB 30c to lower surface 39c of PWB 30c. First substrate 33c is patterned to form pads 33c' and 33c" that cover part of layer 34c. Pads 33c' and 33c" are joined by a portion 34c' of layer 34c. Surface copper structures 37c and 37c' are used to contact pads 33c' and 33c", respectively, so that a controlled resistance can be measured between pads 33c' and 33c" based on the geometry (length and width) of the portion 34c' of layer 34c between the two pads 33c' and 33c".

Figure 4:
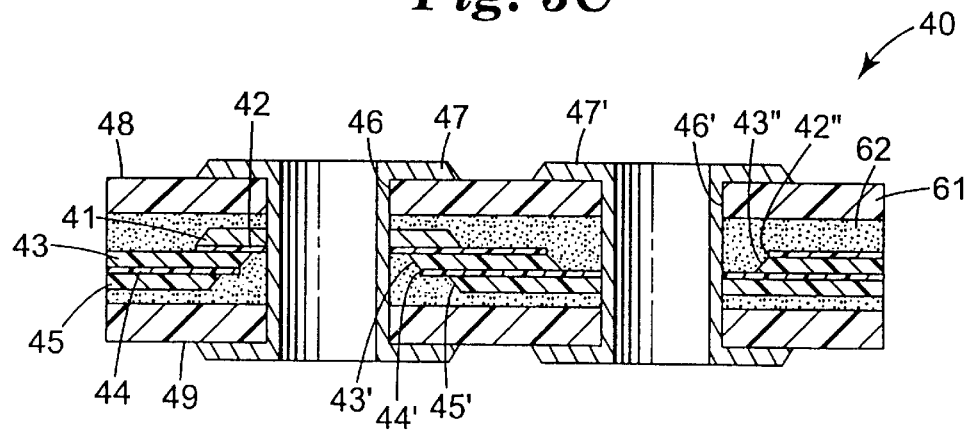
FIG. 4 is a cross-sectional view of a PWB incorporating the article of FIG. 2.

FIG. 4 illustrates PWB 40 comprises a material 61 such as epoxy/fiberglass sandwiching a layer of adhesive or prepeg 62 and a passive electrical article, which functions as both a capacitor and a resistor, of FIG. 2 having patterned layers: first substrate 41, first layer 42, second substrate 43, second layer 44, and third substrate 45 and, in which, contact is made with the first substrate and the third substrate. In FIG. 4, signals or current are routed through PWB 40 by hole 46 or hole 46', which are, electroplated with copper to form surface copper structures 47 and 47', respectively, Surface copper structures 47 and 47' route signals from a trace (not shown) on upper surface 48 of PWB 40 to lower surface 49 of PWB 40. Surface copper structure 47 contacts first substrate 41 and passes though previously patterned and larger holes 43', 44', 45' in second substrate 43, second layer 44, and third substrate 45, respectively. Surface copper structure 47' contacts third substrate 45 and passes through previously patterned and larger holes 42" and 43" in first layer 42 and second substrate 43, respectively. A resistive and capacitive relationship is thus formed between 47 and 47'.

With reference to FIGS. 3A, 3B, 3C, and 4, those skilled in the art will recognize that various combinations of substrates and layers are possible and that various connections to the substrates can be provided to create a variety of functions.

Figure 5A:
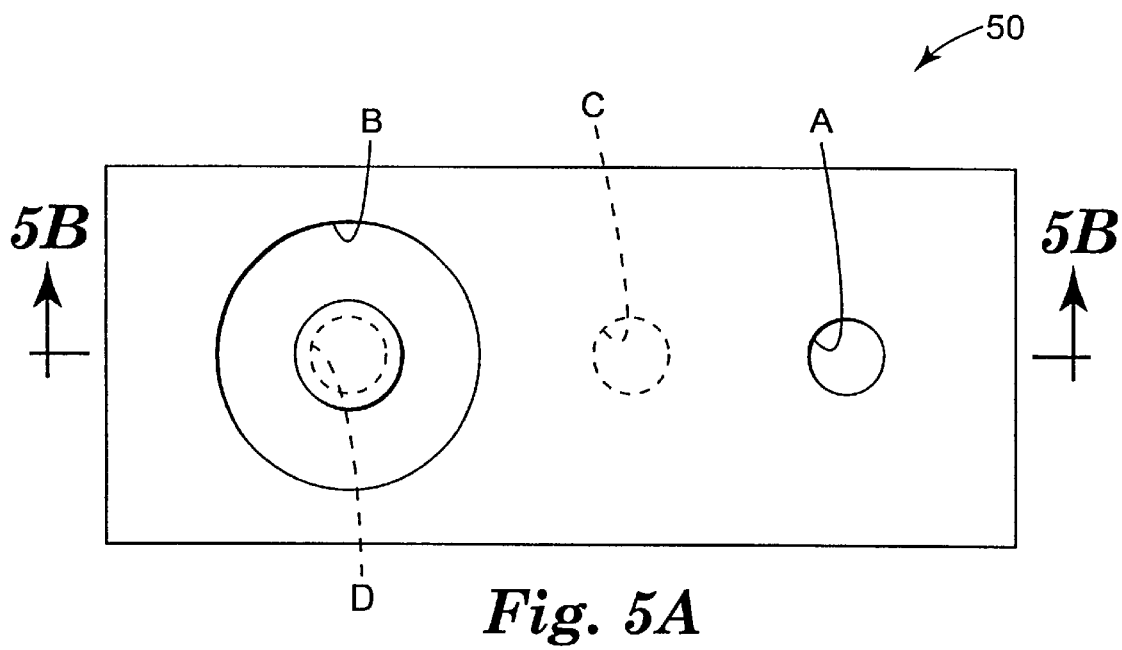
FIG. 5A is a plan view of a passive electrical article, which can function as a capacitor or a resistor of the present invention which can be used to form a flexible circuit.
Figure 5B:
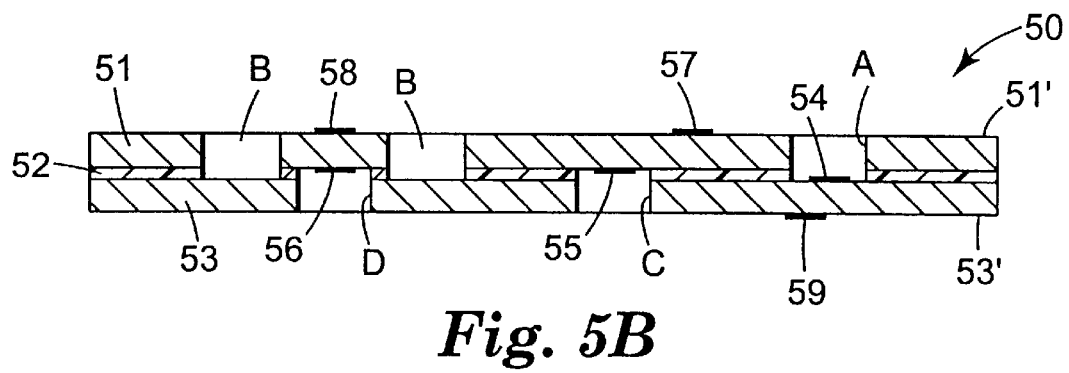
FIG. 5B is a cross-sectional view of the article of FIG. 5A taken along line 5B—5B.

FIGS. 5A and 5B illustrate a plan view and a cross-sectional view, respectively, of a passive electrical article 50 of the present invention, which may function as a capacitor or a resistor, and illustrate examples of how the article may be patterned and contacted to a flexible circuit (not shown). Passive electrical article 50 comprises first substrate 51, second substrate 53, respectively, and layer 52.

Hole A and annular ring B are formed, for example, by patterning, in first substrate 51 and layer 52. Hole C and hole D are formed, for example, patterned, in layer 52 and second substrate 53. The forming of holes passive electrical article 50, that is, patterning, which is illustrative only, provides contacts points 54, 55, and 56. In addition, contacts points 57 and 58 are available on major surface 51' of first substrate 51 and contact point 59 is available on major surface 53' of second substrate 53. The location of contact points illustrated schematically in FIG. 5B are representative only and are omitted from FIG. 5A for clarity only.

Passive electrical article 50 can be effective in a flexible circuit by making contact between at least one of contact points 54, 55, 56, 57, 58, and 59 and a trace (not shown) within flexible circuit (not shown). Suitable trace connections may be made by solder balls, for example, as described in the WO 94/29897, incorporated herein by reference. Connection to contacts points 56 and 58 an be made to provide a through via akin to the through hole of FIG. 3A. In order to take advantage of the capacitive or resistive function of the passive electrical article, connection may be made to either of contact points 55 or 57 in combination with either of contact points 54 or 59. One skilled in the art would understand that a single connection to any of contact points 54, 55, 56, 57, 58, or 59 is possible depending on the desired application.

The present invention also encompasses an electrical device comprising a passive electrical article of the present invention functioning as an electrical circuit of a PWB or flexible circuit, which comprises a passive electrical article in accordance with the present invention. The electrical device may include any electrical devices, which typically employs a PWB or flexible circuit having a capacitive or resistive component. Exemplary electrical devices include cell phones, telephones, fax machines, computers, printers, pagers, and other devices as recognized by one skilled in the art. The passive electrical article of the present invention is particularly useful in electrical devices in which space is at a premium.

This invention is illustrated by the following examples, but the particular materials and amounts thereof recited in these examples, as well as other conditions and details should not be construed to unduly limit this invention.

EXAMPLES

Example 1

Capacitor Article With Particles In The Electrically Insulating Layer

Copper foil substrates available from Carl Schlenk, AG, Nurnberg, Germany, were provided having a thickness of 1.4 mils (36 $\mu$m), an anneal temperature of 140° C., and an average surface roughness (RMS) of 8 nm. Chemisorbed materials were removed in an oxygen/argon plasma using a device from Plasma Science, Foster City, Calif.; the residence time of the foil in the plasma was about 6 minutes. Particulate debris was removed with a vacuum/ultrasonic web cleaner commercially available from Web Systems Inc., Boulder, Colo., under the trade designation "Ultracleaner".

6.4 grams (g) of an epoxy commercially available from Shell Chemical Company, Houston, Tex., under the trade designation "Epon 1001F" and 1.6 g of an epoxy commercially available from Shell Chemical Company under the trade designation "Epon 1050" were dissolved in 18 g of methyl ethyl ketone (MEK) and 27 g of methyl isobutyl ketone (MIBK), both of which are commercially available from Aldrich Chemical, Milwaukee, Wis. 0.8 g of dispersant, a copolymer of polyester and polyamine, commercially available from ICI Americas, Wilmington, Del., under the trade designation "Hypermeer PS3" was added to this mixture.

47 g of barium titanate articles having an average particle size of 0.2 $\mu$m, commercially available from Cabot Performance Materials, Boyertown, Pa., under the trade designation "BT-8", which had been heated in air at 35° C. for 15 hours, were added slowly using a Ross laboratory mixer/emulsifier commercially available from Charles Ross & Sons, Hauppauge, N.Y., with a rotor/stator head running at 2000 revolutions per minute (rpm). Once all of the barium titanate was added, the speed was increased to 6000 rpm and the barium titanate was dispersed for 20 minutes in a container cooled in an ice bath to prevent heating the blend. The resulting blend was 55% solids by weight; the volume ratio of barium titanate to epoxy was 55:45.

The blend was allowed to sit undisturbed overnight to allow poorly dispersed agglomerates to settle. The blend was then filtered through a 2 $\mu$m stainless steel mesh filter to form a first blend. The weight % solids of the first blend was measured as 53% and the volume % loading of barium titanate in the first blend was measured as 53%; both measurements were made gravimetrically.

8.4 g of a 70% by weight solution of "Epon 1001F" in MEK, 1.8 g of a 80% by weight solution of "Epon 1050" in MEK, and 5.4 g of a 5% by weight solution of 2,4,6-tris (dimethylaminomethyl)phenol were filtered through 0.45 $\mu$m filter and then added to 238 g of the first blend to form a second blend. The blend was made homogeneous by stirring or letting the container roll on a ball mill (without balls); final solids content of the second bland was 43% by weight. The volume ratio of barium titanate to epoxy in the second blend was 45:55. The second blend was deaerated using an ultrasonic bath for 5 minutes.

The second blend was separately coated with a microgravure coater (in a cleanroom) onto two copper foils using a web speed of 25 feet/minute (12.7 cm/sec) and a gravure roll speed of 40 feet/minute (20 cm/sec). Gravure rolls were chosen to give a dry coating thickness of from 1 to 1.5 $\mu$m. The coating was dried at 95° C. and then wound onto a core to form a roll.

The two blend-coated copper foils were then laminated together, in a cleanroom, coating side to coating side using a laminator, commercially available from Western Magnum, El Segundo, Calif., with 150° C. rollers at 15 inches/minute (0.64 cm/sec) speed, and an air pressure to the rollers at 20 psi (140 kPa). The laminate was cured in air at 180° C. for 80 minutes.

The cured laminate was tested using the 90° peel test described in the IPC Test Method Manual, IPC-TM-650, trest number 2.4.9 dated October 1988, published by the Institute for Interconnecting and Packaging Electronic Circuits. A force of 3.4 lbs/inch (600 N/m) was required to separate the copper foils. The cured laminate was also tested for capacitance by the following test method: A 2 cm×2 cm electrode was etched onto one side of the laminate using standard photolithographic and copper etching procedures and the capacitance was measured at 1 kiloHertz (kH) using a LCR meter available from Hewlett Packard, Palo Alto, Calif. having model number 4261A. The measured capacitane was 6 nF/cm$^2$ with a dissipation factor of 0.004. Sixty capacitors were prepared and tested in this manner and the yield of good (non-shorted) capacitors was 86.7% of the total 60 capacitors.

Example 2

Capacitor Article With No Particles In The Electrically Insulating Layer

Copper foil substrates available from Carl Schlenk, AG, Nurnberg, Germany, were provided having a thickness of 1.4 mils (36 $\mu$m), an anneal temperature of 175° C., and a surface roughness (RMS) of 24 nm. The foils were cleaned as described in Example 1.

Using the procedure outlined in Example, 1, a ketone solution containing 18% by weight Epon 1001F and Epon 1050 epoxies (8:2 ratio) plus catalyst were coated individually onto two copper foils. The catalyst, 2,4,6-tris (dimethylaminomethyl)phenol, was in a concentration of 1 gram of catalyst per 100 grams of epoxy resin. No barium titanate or other particles were added.

Lamination and curing were performed as described in Example 1. The laminate was tested using the 90° peel test described in the IPC Test Method Manual, IPC-TM-650, test number 2.4.9 dated October 1988, published by the Institute for Interconnecting and Packaging Electronic Circuits. A force of 3.1 lbs/inch (540 N/m) was required to separate the foils. No capacitance measurements were made. The capacitance of the laminate, calculated by assuming a dielectric constant of 3 for the epoxy blend, would have a capacitance of 1.3 nF/cm$^2$ given a thickness of approximately 2 μm for the epoxy layer in the laminate.

Example 3

Capacitor Article With An Aluminum or Copper-Polyester Substrate

Conductors other than copper foil may be used as the substrate for coating the dielectric layer. This is illustrated in the following example where both aluminum foil and a polyester film coated with copper were coated with a blend as described below and tested.

Aluminum foil (grade 1145, H19 heat treatment) having a thickness of 1.4 mil (36 μm) was obtained from Republic Foils, Inc. of Danbury, Conn. This foil had a RMS roughness of 19 nm, and was used as received without additional cleaning.

A barium titanate/epoxy blend was prepared according to the procedure in Example 1. The aluminum foil was coated with this blend using a gravure coater as described in Example 1.

Two blend-coated sheets were heated for 2 minutes at 175° C. in air. These sheets were stacked such that the coated sides of the aluminum sheets were in contact with each other. The stacked sheets were then laminated in a laboratory press (Carver, Menomonie, Wis.) set for 200° C. and 300 psi (2 MPa). The sample was in the press for 1 hour, then removed and cured for an additional hour without pressure at 1752 C. Adhesion for the laminate was 6.0 lbs/inch (1100 N/m) as measured by using a 90° peel test described in Example 1.

In addition, sheets (unlaminated) of aluminum foil were coated and cured in air at 175° C. for one hour. Palladium/gold electrodes were sputtered onto the blend-coated surface through a mask consisting of 5 mm diameter holes, thereby forming capacitors. These capacitors had a capacitance of 21.2 nF/cm$^2$, a dissipation factor of 0.019, with 19% of the capacitors being non-shorted.

Additionally, a 2 mil (50 μm) polyester film with a uniform 200 nm evaporated layer of copper was used as the substrate. Barium titanate/epoxy blend and coating techniques were as described in Example 1. The coating was cured for 1.5 hours under nitrogen at 175° C., then sputtered with 5 mm diameter palladium/gold electrodes as described above. Capacitance was 15.2 nF/cm$^2$, dissipation factor was 0.044, and the yield of good capacitors was 88%. No adhesion measurements were made.

What is claimed is:

1. A method of manufacturing a passive electrical article comprising the steps of:

(1) providing a first metal substrate, having two opposing major surfaces, substantially free of debris or chemisorbed or adsorbed materials and a second metal substrate, having two opposing major surfaces, substantially free of debris or chemisorbed or adsorbed materials, (2) providing a dielectric or conductive blend comprising a resin, (3) coating the blend onto a first major surface of the first metal substrate so that the blend, after curing or drying, forms a layer having a thickness ranging from about 0.5 to about 10 μm, (4) forming a laminate by contacting the first major surface of the second metal substrate or a first major surface of the second metal substrate coated with the blend with the coated first major surface of the first metal substrate using an applied pressure of from 5 to 300 psi, and (5) curing or drying the blend, wherein the first and second metal substrates are annealed before step (2) or as a consequence of (5), wherein the first major surface of the first metal substrate and the first major surface of the second metal substrate have an average surface roughness ranging from about 10 to about 300 nm, and wherein a force required to separate the first and second metal substrates of the passive electrical article at a 90 degree peel angle is greater than about 3 pounds/inch (about 0.5 kN/m).

2. The method of claim 1 wherein the blend is coated in a solvent system.

3. The method of claim 1 wherein the surfaces of the first and second metal substrates are made substantially free of debris or chemisorbed or adsorbed materials is accomplished by surface treatment.

* * * * *